United States Patent [19]
Yoo

[11] Patent Number: 5,928,373
[45] Date of Patent: Jul. 27, 1999

[54] HIGH SPEED TEST CIRCUIT FOR A SEMICONDUCTOR MEMORY DEVICE

[75] Inventor: Jei-Hwan Yoo, Kyungki-do, Rep. of Korea

[73] Assignee: Samsun Electronics, Co., Ltd., Suwon, Rep. of Korea

[21] Appl. No.: 08/724,731

[22] Filed: Sep. 30, 1996

[30] Foreign Application Priority Data

Sep. 30, 1995 [KR] Rep. of Korea ........................ 95-33221

[51] Int. Cl.$^6$ ................................................. G11C 29/00
[52] U.S. Cl. ........................................... 714/719; 714/718
[58] Field of Search ................................. 371/21.2, 21.1; 365/200, 201, 203.03, 221

[56] References Cited

U.S. PATENT DOCUMENTS

| | | | |
|---|---|---|---|
| 5,036,494 | 7/1991 | Wise et al. | 365/230.03 |
| 5,060,230 | 10/1991 | Arimoto et al. | |
| 5,351,213 | 9/1994 | Nakashima. | |
| 5,371,708 | 12/1994 | Kobayashi | 365/221 |
| 5,450,361 | 9/1995 | Iwahashi et al. | 365/200 |
| 5,694,406 | 12/1997 | Liporski | 371/51.1 |

FOREIGN PATENT DOCUMENTS

3928410 A1  3/1990  Germany.
42 06 344 A1  4/1993  Germany.

Primary Examiner—Phung M. Chung
Attorney, Agent, or Firm—Marger Johnson & McCollom, P.C.

[57] ABSTRACT

A semiconductor memory device is tested by sequentially coupling a plurality of global input/output lines to a comparator which compares data bits from the global input/output lines sequentially rather than in parallel so as to reduce the number of output sense amplifiers. This reduces both the chip area, and the excessive current consumption caused by large numbers of sense amplifiers operating in parallel. The memory device includes a plurality of global input/output lines coupled to a memory cell array to receive data from the memory cell array. A global line select circuit generates sequential global line select signals during a test operation. A plurality of switch circuits selectively couples data from the global input/output lines to a sense amplifier responsive to the global line select signals. A comparator coupled to the output port of the sense amplifier sequentially compares a sequence of test data output from the sense amplifier and generates a result signal during the test operation.

16 Claims, 7 Drawing Sheets

HIGH SPEED TEST CIRCUIT FOR A SEMICONDUCTOR MEMORY DEVICE

This application corresponds to Korean Patent Application No. 33221/1995 filed Sep. 30, 1995 in the name of Samsung Electronics Co., Ltd., which is herein incorporated by reference.

BACKGROUND OF THE INVENTION

1. Field of the Invention

The present invention relates generally to semiconductor memory devices and more particularly to a method and apparatus for high speed testing of semiconductor memory devices.

2. Description of the Related Art

A typical semiconductor memory device includes a memory cell array for storing data, and peripheral circuits for controlling the transfer of data to and from the memory cell array. It is essential to test each unit memory cell in the memory cell array and also the individual peripheral circuits for proper operation to realize a perfect semiconductor memory device. Most defective semiconductor memory devices contain a single bad bit. The established method of testing a memory device requires reading each bit individually to test for defects. However, this test method takes an excessive amount of time and is very expensive.

More recently, multi-bit parallel testing methods which test multiple memory cells during one access cycle have been developed. It is especially important to shorten the test time and reduce test costs when testing high capacity memory device with capacities over 256 Mbit. Therefore, many companies and research organizations have been working to develop new testing methods.

Figure 1:
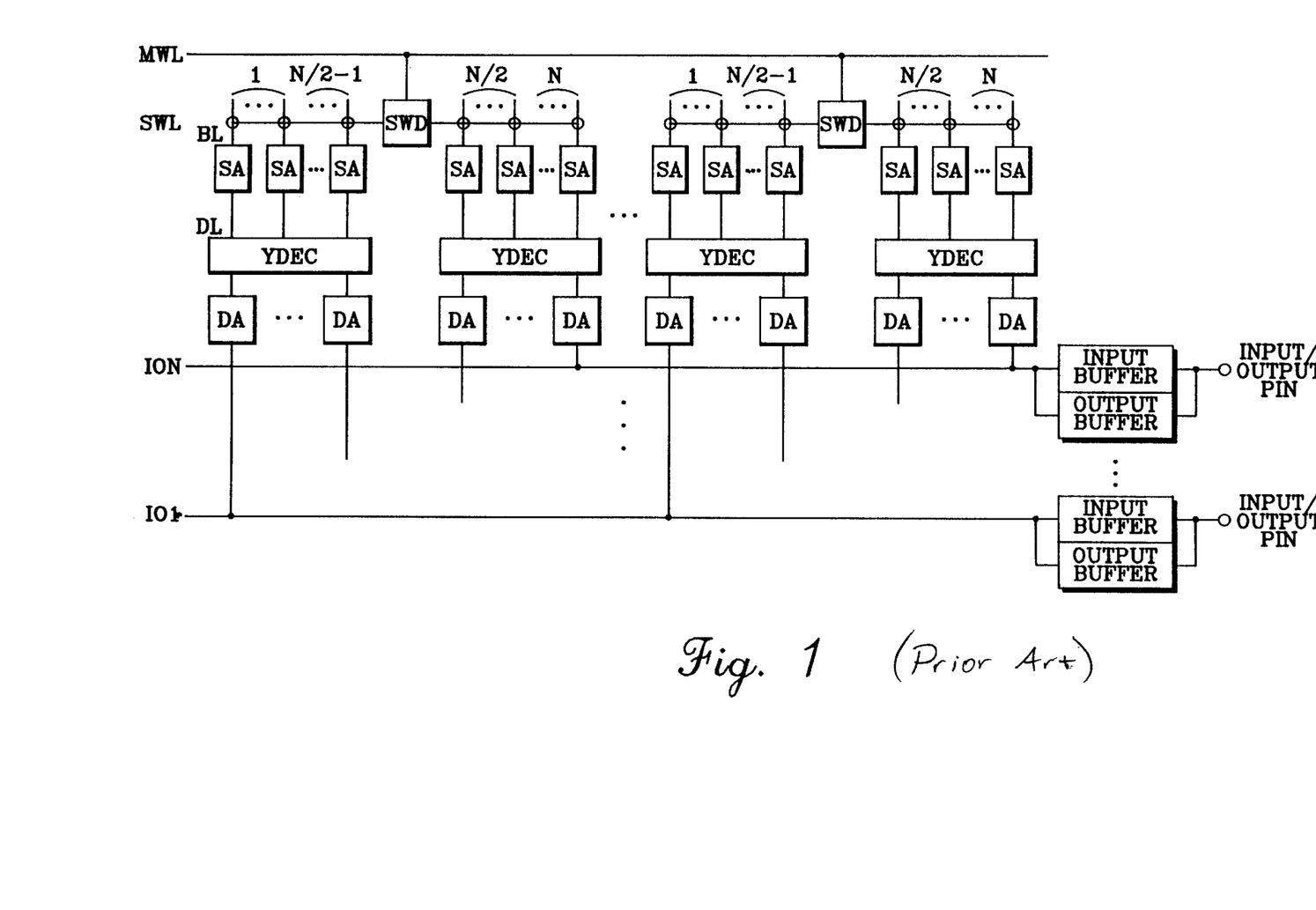
FIG. 1 is schematic diagram of the data output path of a prior art semiconductor memory device.

One such method appeared in the NEC's VLSI circuits symposium in 1993 and will be described with reference to FIGS. 1, 2 and 3. Referring to FIG. 1, the data output path of a semiconductor memory device has a sub-word line driver. Multiple sub-word line drivers SWD are connected to a main word line MWL which is connected to the output port of a row decoder which is not shown in this drawing. The sub-word lines SWL are connected to each end of the sub-word line drivers SWD. Pairs of bit lines are arranged vertically on each sub-word line SWL. One bit line sense amplifier SA is connected to each pair of bit lines. The output port of each bit line sense amplifier SA is connected to the input port of a column decoder YDEC through a data line DL. Multiple output sense amplifiers DA are connected to the output port of each column decoder YDEC. The output sense amplifiers are connected to input/output lines IO respectively. The output port of an input buffer and the input port of an output buffer are connected to each input/output line I/O. The input port of the input buffer and the output port of the output buffer are connected together to one input/output.

Figure 2:
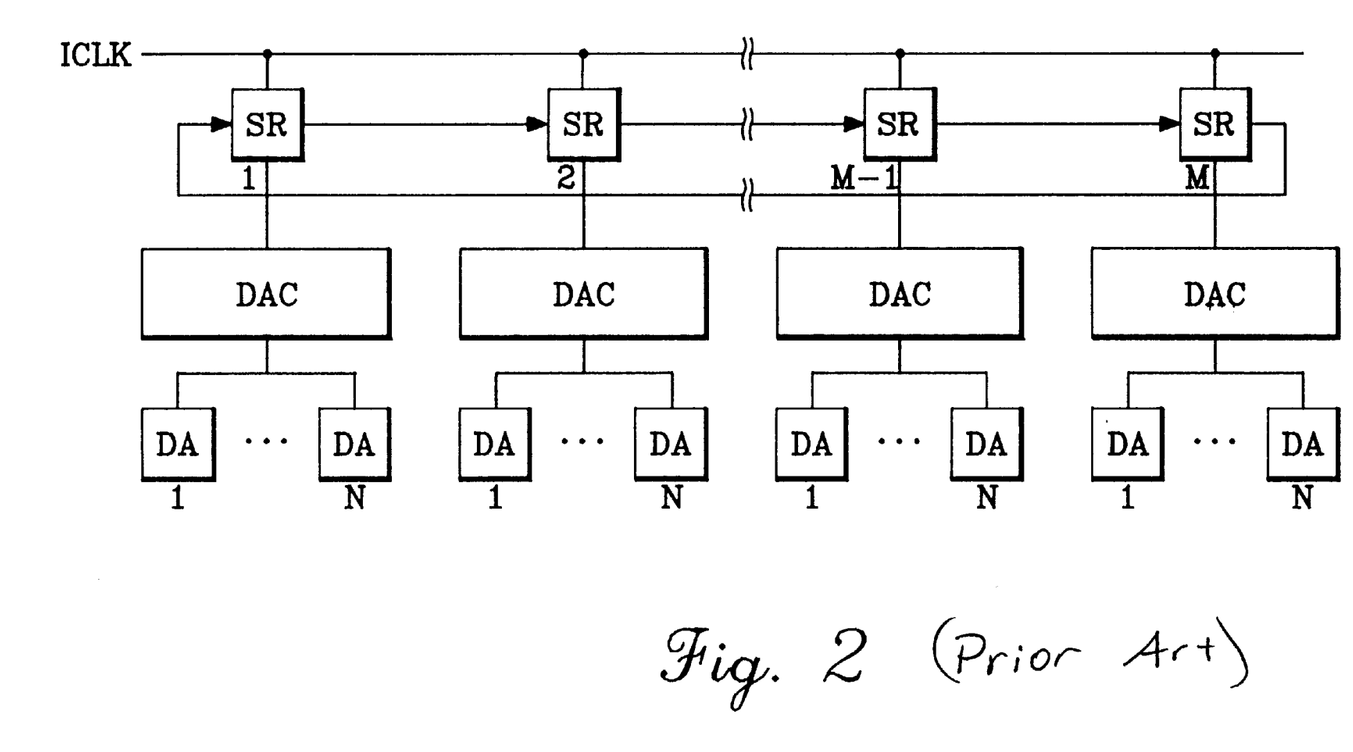
FIG. 2 is a block diagram of a prior art test circuit used with the memory device of FIG. 1.

FIG. 2 is a schematic diagram of a test circuit for use with the memory device of FIG. 1. The array blocks associated with each sub-word line driver are selected by output signals from shift registers SR. The output signals of shift registers SR are synchronized with an internal clock and are output sequentially in a regular manner. In an array block connected to a sub-word line driver SWD, there are multiple (N in the example of FIG. 2) output sense amplifiers DA. The output sense amplifier DA is operated by a control signal DAE from an input/output control circuit DAC which responds to the output signal of the shift register.

Figure 3:
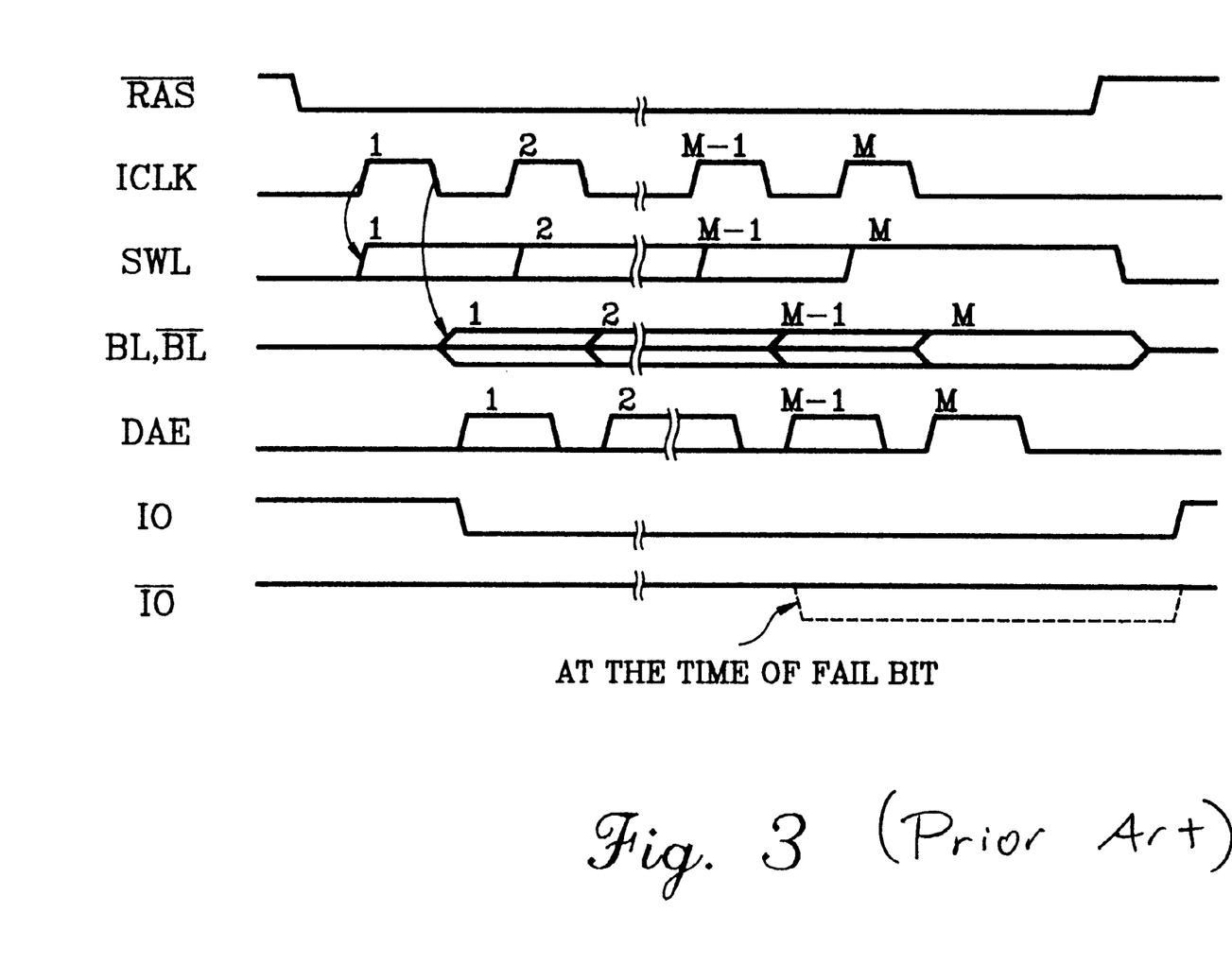
FIG. 3 is a timing diagram showing operation of the circuits of FIGS. 1 and 2.

FIG. 3 is a timing diagram showing waveforms of various signals associated with the circuits of FIGS. 1 and 2. A typical test process will be explained with reference to FIGS. 1, 2, and 3. One test cycle is initiated by the activation of the section row address strobe signal /RAS. The sub-word lines SWL are enabled sequentially by the internal clock ICLK during the test. The control signal DAE to each output sense amplifier DA is synchronized with a pulse of the internal clock signal in the test cycle. The output from output sense amplifier DA is read in a short cycle. By using a high frequency counter and controlling the word line enable, the bit line sensing, and the data line sensing, the data can be output sequentially during a short cycle. Thus, the output time required for conducting the test is reduced.

However, a problem with this prior art technique is that the large number of sense amplifiers in each array block (N in FIGS. 1 and 2) increases the layout area, and thus the cost, of the chip.

Another problem with the prior art test arrangement is that it increases the difficulty of designing the chip. The additional circuits needed for the sub-word line driver, shift register, bit line sensing circuitry, and data line sensing circuitry increase the layout area of the chip and interrupts the integration process.

A further problem with the test arrangement of FIGS. 1 and 2 is that the output sense amplifier must be enabled and disabled selectively by the shift register which requires at least 7 nanoseconds. Therefore it is difficult to operate the semiconductor memory device at high speeds.

Yet another problem with the prior art test method is that is consumes excessive electric power. Data is typically accessed 16-bits at a time during normal operation for one access cycle. However, to test 256 memory cells at one time, 256 input/output lines are needed, and 256 output sense amplifiers must operate at the same time. This causes excessive power consumption.

Accordingly, a need remains for a technique for high speed testing of a highly integrated semiconductor memory device which overcomes the problems discussed above.

SUMMARY OF THE INVENTION

It is, therefore, an object of the invention to provide a highly integrated semiconductor memory device and test circuit.

Another object of the present invention is to provided a method of testing a semiconductor memory device at high speed.

A further object of the invention is to reduce the amount of current consumed while testing a semiconductor memory device at high speed.

To achieve these and other objects, the applicant has invented a method and apparatus for testing a semiconductor memory device by sequentially coupling a plurality of global input/output lines to a comparator which compares data bits from the global input/output lines sequentially rather than in parallel. An advantage of the present invention is that it reduces the chip area required for implementing the test circuit because the number of output sense amplifiers is reduced. Another advantage is that the current required for the sense operation is also reduced.

One aspect of the present invention is a semiconductor memory device comprising: a memory cell array; a plurality of global lines coupled to the memory cell array to receive data from the memory cell array; a global line select circuit that generates sequential of global line select signals during a test operation; a sense amplifier having an input port and an output port; a plurality of switch circuits, each switch circuit coupled between one of the global lines and the input port of the sense amplifier to selectively couple data from the one global line to the sense amplifier responsive to one of the sequential global line select signals; and a comparator coupled to the output port of the sense amplifier to sequentially compare a sequence of data output from the sense amplifier and generate a result signal during the test operation. the one sense amplifier during the test operation.

Another aspect of the present invention is a method for testing a semiconductor memory device comprising: generating sequential of global line select signals; sequentially coupling data from a plurality of global lines to a sense amplifier responsive to the sequential global line select signals, thereby generating a sequence of data; sequentially comparing the sequence of data; and generating a fail signal if the data is incorrect.

The foregoing and other objects, features and advantages of the invention will become more readily apparent from the following detailed description of a preferred embodiment of the invention which proceeds with reference to the accompanying drawings.

DETAILED DESCRIPTION OF THE PREFERRED EMBODIMENT

Figure 4:
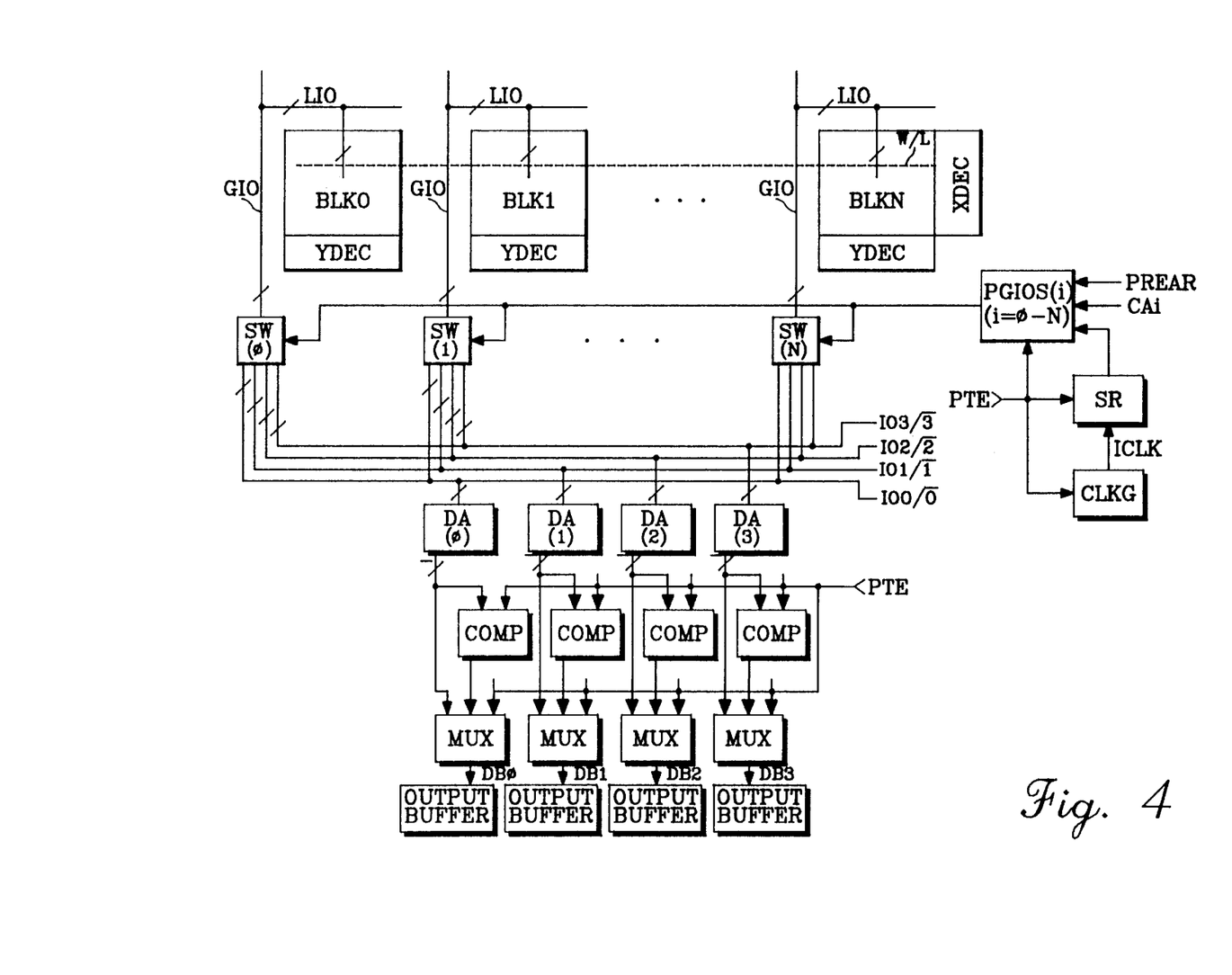
FIG. 4 is a block diagram of an embodiment of a semiconductor memory in accordance with the present invention.

Referring to FIG. 4, a semiconductor memory device in accordance with the present invention includes a memory cell array which is divided into multiple memory blocks BLK0–BLKN. The memory blocks are connected to a common row decoder XDEC, and each block is connected to an individual column decoder YDEC. In FIG. 4, a global data line group GIO is shown to the left of each memory block. Each global line GIO is selectively connected to the input/output lines of a memory cell through a local line group LIO. The global line group GIO and the local line group LIO are a group of line pairs. In the embodiment of FIG. 4, the global line group GIO and the local line group LIO each comprise four line pairs.

During normal operation, a global line group GIO is selected by a column address signal for a predetermined bit. During a test operation, the end of each global line group GIO is selectively connected by switching circuits SW(0)–SW(N) to the input port of output sense amplifiers DA under the control of global select signals PGIOSi generated by a global line select circuit which includes a shift register SR. During normal operation, first data lines FDBi (i=0–3) from the output ports of the output sense amplifiers are connected to the output buffers through multiplexers MUX. During a test operation, the first data lines are connected to comparators COMP. The comparators COMP compare multiple serial inputs rather than parallel inputs. The resulting output signals COMO of the comparators COMP are transmitted to the output buffers through the multiplexers MUX.

Figure 5:
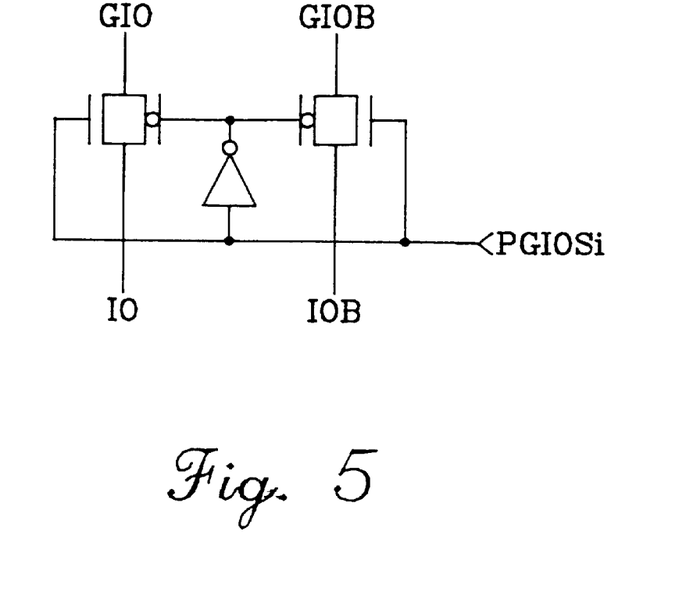
FIG. 5 is a schematic diagram of an embodiment of a switching circuit of FIG. 4.

FIG. 5 is a schematic diagram of an embodiment of a switch within a switching circuit of FIG. 4. Referring to FIG. 5, the global lines GIO and GIOB are selectively connected to the input/output lines IO and IOB by the global line selects signal PGIOS from the global line control circuit shown in FIG. 6.

Figure 6:
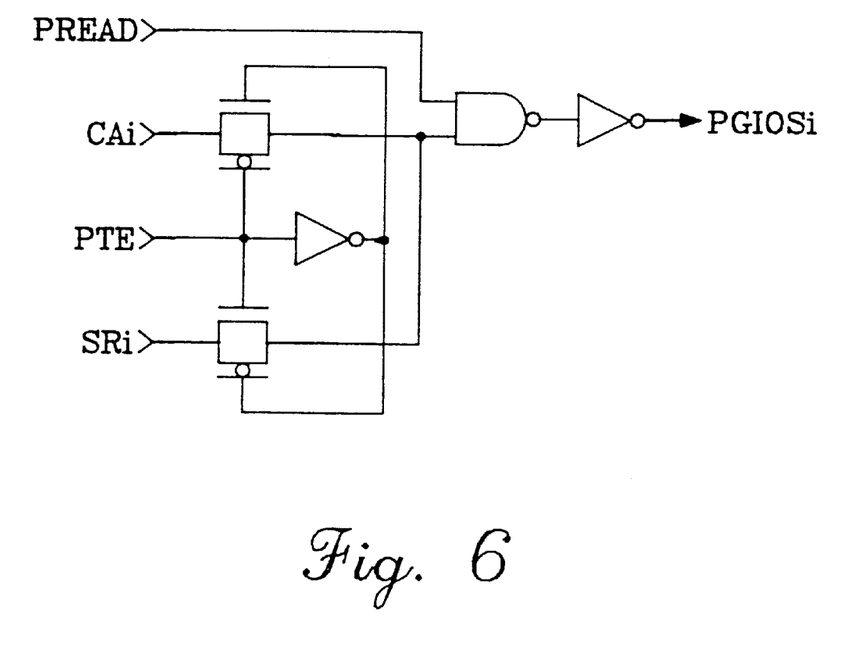
FIG. 6 is a schematic diagram of an embodiment of a global line control circuit which is part of the global line select circuit of FIG. 4.

FIG. 6 is a schematic diagram of an embodiment of a global line control circuit which is part of the global line select circuit of FIG. 4. Referring to FIG. 6, the global line control circuit receives a column address signal CAi, a test enable signal PTE, the output signals SRi of shift register SR, and reading control signal PREAD. The global line control circuit generates the global line control signals PGIOi responsive to the reading control signal. The reading control signal PREAD is in the "HIGH" state only during the reading period. During normal operation in which the test enable signal PTE is in the "LOW" state, the column address signal CAi is used to select one of N memory blocks BLK0–BLKN. During a test operation, the shift register output signals SRi of the shift register are selected, and the global line select signals PGIOSi are output sequentially.

Figure 7:
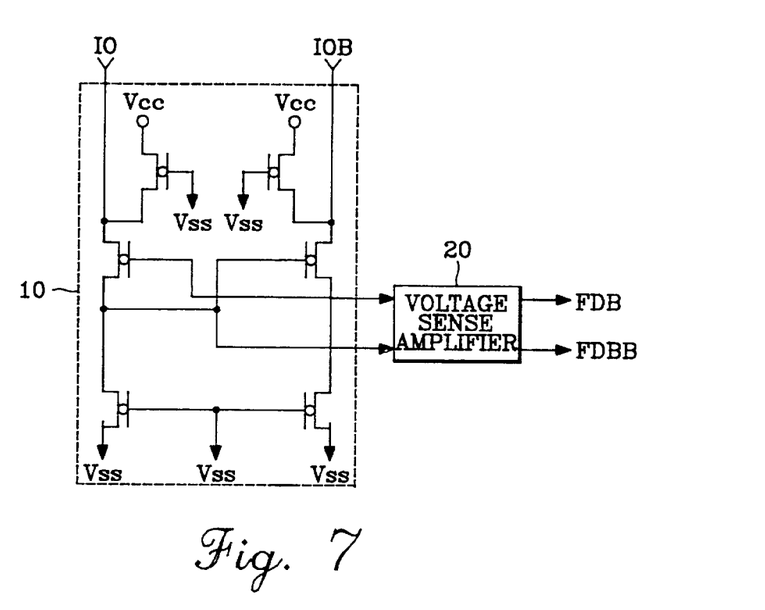
FIG. 7 is a schematic diagram of the output sense amplifier shown in FIG. 4.

FIG. 7 is a schematic diagram of an output sense amplifier of FIG. 4. As shown in FIG. 7, the input/output lines IO and IOB are connected to the input port of a general current sense amplifier 10, and the output port of the general current sense amplifier 10 is connected to the input port of a general voltage sense amplifier 20. The output port of the voltage sense amplifier 20 is connected to the first data lines FDB and FDBB. The construction and operation of the current sense amplifier and the voltage sense amplifier are widely known in the art.

Figure 8:
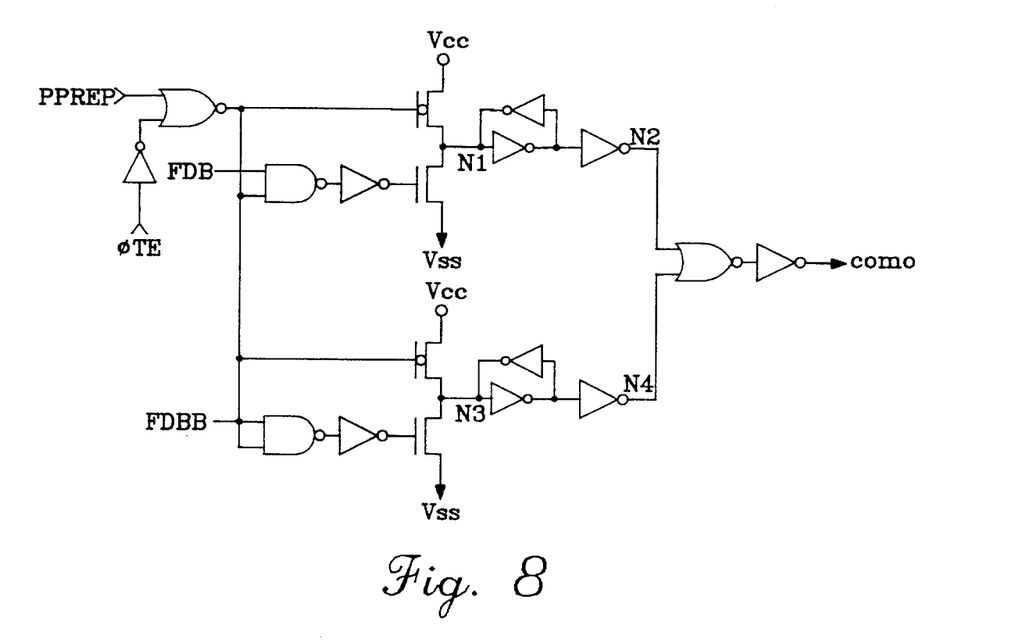
FIG. 8 is a circuit diagram of an embodiment of a comparator shown in FIG. 4.

FIG. 8 is a schematic diagram of a comparator of FIG. 4. As shown in FIG. 8, a comparison control signal PPREP is a pulse signal that is synchronized to the rising edge of the clock signal CLK and has a predetermined width T1. The comparator operates only when the test enable signal PTE is in the "HIGH" state so as to precharge nodes N1 and N3 to the "HIGH" state. For example, in a case in which N=15, the signals SRi are generated 16 times (i=0–15), and the data loaded on the global line GIO is sensed at the output sense amplifier DA. If the data bits are the same all 16 times, the resulting output signal COMO of comparator COMP remains HIGH. However, if at least one of the data bits is different from the others, the output terminal of the comparator generates a fail signal by driving the output low. Therefore, it is possible to determine whether the device is bad or not.

Referring again to FIG. 4, the present invention requires a high frequency clock generator whose output is the internal clock ICLK in FIG. 4. The clock generator CLKG divides an external clock CLK and outputs a high frequency internal clock. The multiplexers MUX, the shift register SR, and the clock generator CLKG are well known in the art, and any suitable type of construction can be used in this embodiment.

Figure 9:
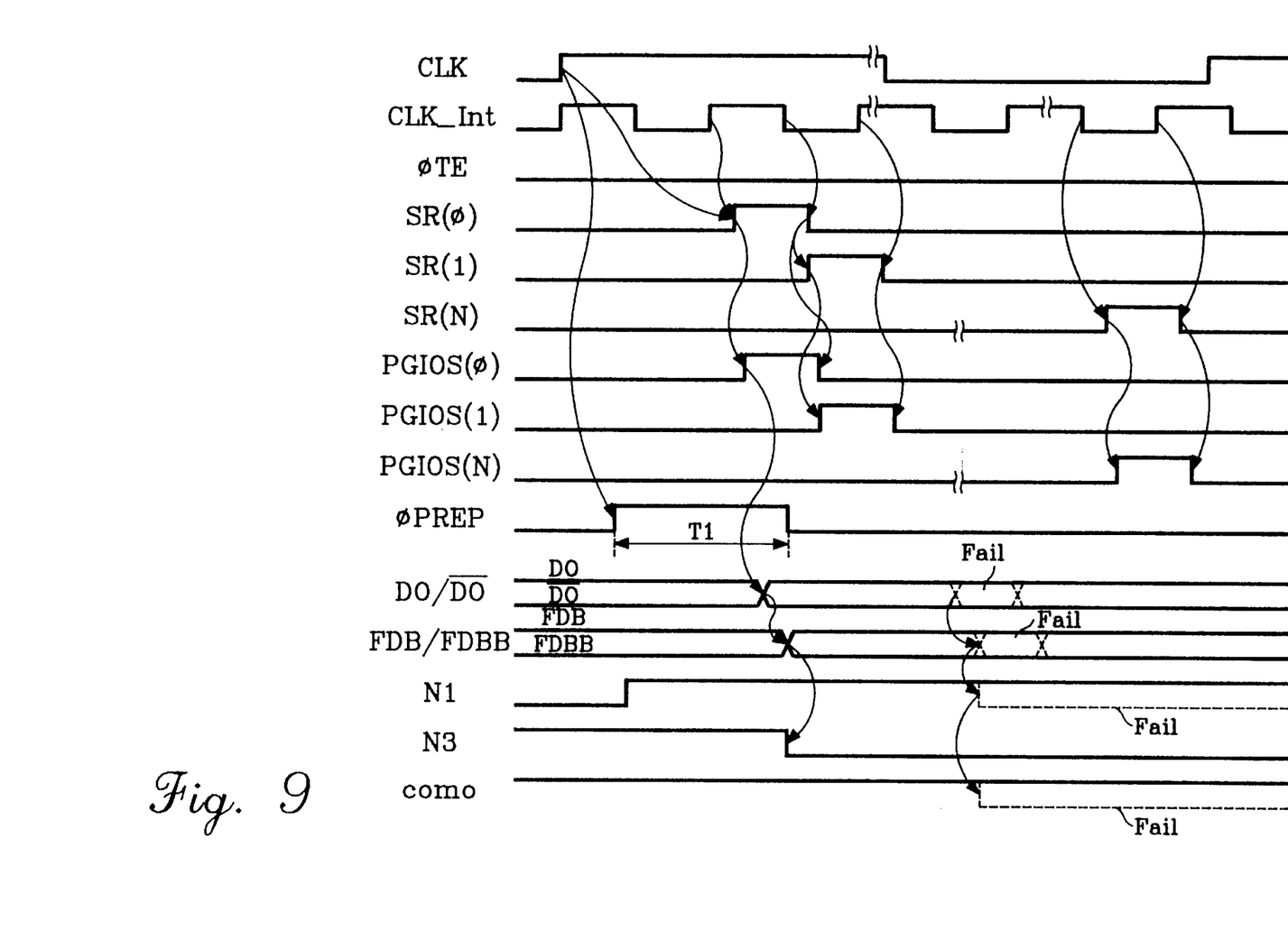
FIG. 9 is a timing diagram showing waveforms of various signals throughout the circuits of FIGS. 4–8.

FIG. 9 is a timing diagram showing waveforms of various signals throughout the circuits of FIGS. 4–8. During a high speed test operation, the output signals SRi of the shift register are synchronized with the internal clock ICLK and enabled and disabled sequentially. The output signals SRi are input to the global line control circuit which sequentially outputs the global line control signals PGIOSi. After the rising edge of the external clock, the comparator COMP is pre-charged for a predetermined time T1 by the comparison control signal PPREP. Then, if the data sensed by the output sense amplifier DA is loaded on the first data lines FDB and FDBB, node N3 or N4 (shown in FIG. 8) is changed from a "HIGH" to a "LOW" state, and the output signals of the global line control circuit are output sequentially. At this time, if the data on the global line is all alike, the output of the comparator remains in the "HIGH" state. If even one of the data bits is different, the output of the comparator generates a fail signal by switching to the "LOW" state.

An advantage of a test circuit constructed and operated according to the present invention is that it greatly reduces the number of the output sense amplifiers DA and input/output lines IO, thus reducing the chip area required for the test circuit. A further advantage is that it is easy to design a semiconductor memory device according to the present invention because the output of the shift register is used only as the input for the switching means. The shift register does not take much area on a chip, so the loss caused by the layout is reduced. A further advantage is that it is possible to raise the maximum operating frequency up to at least 250 MHz by continuously operating the output sense amplifier DA and changing its input. Here, the time used for one cycle is just 4 nanoseconds, so it is possible for the test circuit to operate to a very high frequency. Yet another advantage of the present invention is that it substantially reduces the consumption of electric power because the number of the operating output sense amplifiers typically decreases by a factor of 8 or 16. A further advantage is that the internal circuitry of the comparator is also easy to design.

Having described and illustrated the principles of the invention in a preferred embodiment thereof, it should be apparent that the invention can be modified in arrangement and detail without departing from such principles. I claim all modifications and variations coming within the spirit and scope of the following claims.

I claim:

1. A semiconductor memory device comprising:
    a memory cell array
    a plurality of global lines coupled to the memory cell array to receive data from the memory cell array;
    a global line select circuit that generates sequential global line select signals during a test operation;
    a sense amplifier having an input port and an output port;
    a plurality of switch circuits, each switch circuit coupled between one of the global lines and the input port of the sense amplifier to selectively couple data from the one global line to the sense amplifier responsive to one of the sequential global line select signals; and
    a comparator coupled to the output port of the sense amplifier to sequentially compare data output from the sense amplifier and generate a result signal during the test operation.

2. A semiconductor memory device according to claim 1 wherein each global line is pair of input/output lines.

3. A semiconductor memory device according to claim 1 further including a multiplexer for selectively coupling either a normal data signal from the sense amplifier or a result signal from the comparator to the exterior of the memory device.

4. A semiconductor memory device according to claim 3 further including an output buffer coupled between the multiplexer and the exterior of the memory device.

5. A semiconductor memory device according to claim 1 wherein the global line select circuit includes a shift register that generates sequential shift register output signals.

6. A semiconductor memory device according to claim 5 wherein the global line select circuit further includes a plurality of global line control circuits, each global line control circuit selectively coupling either a column address signal or one of the shift register output signals to one of the switch circuits.

7. A semiconductor memory device according to claim 6 wherein each global line control circuit includes:
    a NAND gate having a first input terminal for receiving a reading control signal, a second input terminal, and an output terminal for generating a global line select signal;
    a first transmission gate having an input terminal for receiving the column address signal, an output terminal coupled to the second input terminal of the NAND gate, and at least one control terminal for receiving a test enable signal; and
    a second transmission gate having an input terminal for receiving the one shift register output signal; an output terminal coupled to the second input terminal of the NAND gate, and at lest one control terminal for receiving a test enable signal.

8. A semiconductor memory device according to claim 1 wherein the global line select circuit includes an internal clock that generates a high frequency internal clock signal from an external clock signal.

9. A semiconductor memory device according to claim 1 wherein each switch circuit includes at least one switch that couples a global line pair to the sense amplifier, the switch including:
    a first transmission gate having an input terminal coupled to one of the lines of the global line pair, an output terminal coupled to the sense amplifier, and at least one control terminal for receiving one of the global line select signals; and
    a second transmission gate having an input terminal coupled to the other line of the global line pair, an output terminal coupled to the sense amplifier, and at least one control terminal for receiving the one of the global line select signals.

10. A semiconductor memory device according to claim 1 wherein the comparator circuit includes:
    a first data input terminal and a second data input terminal for receiving a sequence of data from an input/output line pair;
    a first control input terminal for receiving a test enable signal that enables the comparator;
    a second control input terminal for receiving a comparison control signal that precharges a first node and a second node; and
    a comparator output terminal that generates a fail signal if the bits in the sequence of data are different.

11. A semiconductor memory device comprising:
    a memory cell array
    a plurality of global line groups coupled to the memory cell array to receive data from the memory cell array, each global line group having a plurality of global lines;
    a global line select circuit that generates sequential global line select signals during a test operation;

a plurality of sense amplifiers, each sense amplifier having an input port and an output port;

a plurality of switch circuits, each switch circuit coupled between one of the global line groups and the plurality of sense amplifiers to couple each one of the global lines in the one global line group to the input port of one of the sense amplifiers responsive to one of the sequential global line select signals; and a plurality of comparators, each comparator coupled to the output port of one of the sense amplifiers to sequentially compare data output from the one sense amplifier during the test operation.

12. A method for testing a semiconductor memory device comprising:

generating sequential global line select signals;

sequentially coupling data from a plurality of global lines to a sense amplifier responsive to the sequential global line select signals, thereby generating sequential data;

sequentially comparing the data; and generating a fail signal if the data is incorrect.

13. A method according to claim 12 wherein generating the sequential global line select signals includes:

generating sequential shift register signals; and selectively coupling each of the shift register signals to a plurality of switch circuits.

14. A method according to claim 12 wherein generating the sequential global line select signals includes generating a high frequency internal clock signal from an external clock signal.

15. A method according to claim 12 further including multiplexing either the fail signal or data from the sense amplifier.

16. A test circuit for a semiconductor memory device comprising:

a memory cell array;

a sense amplifier coupled to the memory cell array to amplify sequential data bits received from the memory cell array; and a comparator coupled to the sense amplifier to receive the sequential data bits, the comparator sequentially comparing the data bits and generating a fail signal if any one of the bits in the sequence differs from the remaining bits.

* * * * *

UNITED STATES PATENT AND TRADEMARK OFFICE
CERTIFICATE OF CORRECTION

PATENT NO.    : 5,928,373 Page 1 of 1
DATED         : July 27, 1999
INVENTOR(S)   : Jei-Hwan Yoo It is certified that error appears in the above-identified patent and that said Letters Patent is hereby corrected as shown below:

<u>Title page,</u>
Item [73], Assignee: Samsun" should be -- Samsung --.
Item [56], References Cited, U.S. PATENT DOCUMENTS: "Liporski" should be
-- Lipovski --.

<u>Column 2,</u>
Line 65, "sequential of global" should be -- sequential global --.

<u>Column 3,</u>
Line 12, "sequential of" should be -- sequential --.

Signed and Sealed this

First Day of October, 2002

Attest:

Attesting Officer

JAMES E. ROGAN
*Director of the United States Patent and Trademark Office*